(12) United States Patent
Kraft et al.

(10) Patent No.: US 12,093,089 B2
(45) Date of Patent: Sep. 17, 2024

(54) GENERIC IN-VEHICLE COMPUTE SYSTEM

(71) Applicant: Harman Becker Automotive Systems Gmbh, Karlsbad (DE)

(72) Inventors: Günther Kraft, Karlsruhe (DE); Krunoslav Orcic, Karlsruhe (DE); Jibin Yuan, Ettlingen (DE); Andreas Koerner, Waldbronn (DE); Yanfei Sun, Shanghai (CN); Christian Zappe, Malsch (DE); Frank Gitzinger, Straubenhardt (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 275 days.

(21) Appl. No.: 17/639,839

(22) PCT Filed: Sep. 14, 2020

(86) PCT No.: PCT/IB2020/000743
§ 371 (c)(1),
(2) Date: Mar. 2, 2022

(87) PCT Pub. No.: WO2021/069965
PCT Pub. Date: Apr. 15, 2021

(65) Prior Publication Data
US 2022/0326743 A1    Oct. 13, 2022

(30) Foreign Application Priority Data

Oct. 10, 2019    (WO) ................ PCT/CN2019/110426

(51) Int. Cl.
*G06F 1/18*    (2006.01)
*B60R 16/023*    (2006.01)
(Continued)

(52) U.S. Cl.
CPC .......... *G06F 1/181* (2013.01); *B60R 16/0239* (2013.01); *G06F 1/20* (2013.01); *H05K 7/20136* (2013.01)

(58) Field of Classification Search
CPC .............. G06F 1/18; G06F 1/181; G06F 1/20; B60R 16/023; H05K 7/20136
(Continued)

(56) References Cited

U.S. PATENT DOCUMENTS 6,501,368 B1    12/2002    Wiebe et al.
6,973,378 B2 *  12/2005    Yamada .............. G01M 17/007
                                                                  701/1

(Continued)

FOREIGN PATENT DOCUMENTS

DE    202018105312 U1    7/2019

*Primary Examiner* — Andrew Joseph Rudy
(74) *Attorney, Agent, or Firm* — Angela M. Brunetti

(57) ABSTRACT

A generic domain compute system that is customizable for at least one domain or zone compute in a vehicle having a gateway power and control (GAPAC). The GAPAC has a power supply, a scalable microcontroller, a power management integrated circuit, a set of standardized and scalable external connectors for external inter-connections for Ethernet and car connector, a standard and scalable internal connector for internal inter-connections for power, control and generic busses. At least a first compute extension (COMEX) has a standard and scalable connecter internally connected to the GAPAC. The COMEX has a scalable microcontroller, a power management integrated circuit and a set of standardized and scalable connectors for external inter-connections. The COMEX is supplied with a permanent voltage from the GAPAC power supply. The microcontrollers, external connectors and internal connectors are scaled according to the domain or zone compute application.

15 Claims, 8 Drawing Sheets

(51) Int. Cl.
*G06F 1/20* (2006.01)
*H05K 7/20* (2006.01)

(58) Field of Classification Search
USPC .......................................................... 701/24
See application file for complete search history.

(56) References Cited

U.S. PATENT DOCUMENTS

| | | | |
|---|---|---|---|
| 7,164,272 B1 * | 1/2007 | Borrego Bel | H02J 7/005 |
| | | | 324/426 |
| 10,481,652 B2 * | 11/2019 | Rice | H05K 7/20927 |
| 10,585,846 B2 * | 3/2020 | Wang | G06F 1/1698 |
| 11,191,190 B2 * | 11/2021 | Stefanoski | H05K 7/20881 |
| 11,433,737 B2 * | 9/2022 | Straub | H05K 7/20254 |
| 11,436,844 B2 * | 9/2022 | Carruthers | H04N 7/181 |
| 2004/0167690 A1 | 8/2004 | Yamada | |
| 2019/0042530 A1 | 2/2019 | Wang | |
| 2019/0171258 A1 | 6/2019 | Rice | |

* cited by examiner

|  | Domain Gateway Power & Control | Compute Extension 1 | Compute Extension 2 | Ext. Interconnect | | Thermal |
|---|---|---|---|---|---|---|
| System Application | GAPAC | COMEX1 | COMEX2 | Loop Back | Details | Cooling |
| Cabin Compute | GAPAC_C | Compute Node | no | no | Opt. PCIe or Alternative | Air |
| Cabin Compute Base ADAS | GAPAC_C | Compute Node | ADAS Base Node | yes | Opt. PCIe or Alternative | Air |
| Body Compute | GARPAC | no | no | no | --- | Passive |
| Body Compute & Audio | GARPAC | Audio Node | no | no | --- | Air / Liquid |
| ADAS Compute High | GARPAC | ADAS High Node B(D) | ADAS High Node B(D) | no | Opt. PCIe or Alternative | Air / Liquid |
| Central Gateway | GARPAC | no | no | no | --- | Passive |
| Central Gateway & Telematics | GAPAC_C | Telematic Node | no | no | --- | Passive |

GENERIC IN-VEHICLE COMPUTE SYSTEM

CROSS-REFERENCE TO RELATED APPLICATIONS

The present application claims priority to PCT application CN2019/110426 filed Oct. 10, 2019.

TECHNICAL FIELD

The present disclosure is directed to a generic in-vehicle compute system and more specifically to a modular generic in-vehicle compute system that is adaptable and extendable as a modular system to derive different domain computes.

BACKGROUND

Todays in-vehicle architecture is divided into several domains such as cabin/cockpit, body, Autonomous Driver Assistance Systems) ADAS and the like. Each domain includes many sub-systems. For example, cabin/cockpit includes systems such as telematics, navigation, entertainment, safety, climate control, Autonomous Driver Assistance Systems, user interfaces, touch screens, speech recognition systems and the like, which may require several Electronic Control Units (ECU). To reduce the number of ECUs, reduce cabling and to reduce the overall complexity, sub-systems are being combined into a few domain compute systems. To accomplish this, hardware and applications are separated to achieve a higher flexibility of functional deployment on the remaining domain computes. As a result, inter-connecting the domains takes place with higher bandwidth communications standards such as Ethernet and Peripheral Component Interconnect Express (PCIe) or Thunderbolt.

Until such a central compute system is implemented, whenever a change or improvement is made to one or more existing vehicle systems, current in-vehicle architecture requires significant re-design of hardware systems and significant programming of software programs. The cost to re-design, re-program, and maintain interconnection of the systems is time consuming and expensive causing undesirable delay in bringing changes and improvements to market.

SUMMARY

An in-vehicle generic domain compute system provides a system solution which allows maximum re-use of hardware assets, software assets and board support packages among different domain computes. The system supports a Domain Compute architecture that supports Gateway, Body Compute, Mixed Compute, Cabin Compute, Autonomous Compute, Central Compute, Connectivity Gateway domains and Central Storage. The system includes an inner box which hosts a data gateway with Ethernet and CAN. A first outer compute node hosts a system on a chip (SoC) with various inputs like sensor inputs and various outputs like actuators, displays and so on. An optional second outer computing node with various inputs like sensors and data, and various outputs like actuators, displays and so on. The inner box, first outer computing node and second outer computing node are arranged as a box on box on box system wherein the inner box is in the middle of the first and second outer computing nodes. As a second alternative, the outer computes could be connected by cable.

DESCRIPTION OF DRAWINGS

FIG. 11 is a chart of requirements for each of the Domain Computes of FIGS. 5-10.

Elements and steps in the figures are illustrated for simplicity and clarity and have not necessarily been rendered according to any specific arrangement. For example, elements are illustrated in the figures to help to improve understanding of one or more embodiments of the present disclosure.

DETAILED DESCRIPTION

While various aspects of the present disclosure are described with reference to an illustrative embodiment, the present disclosure is not limited to such embodiments, and additional modifications, applications, and embodiments may be implemented without departing from the present disclosure. In the figures, like reference numbers will be used to illustrate the same components. Those skilled in the art will recognize that the various components set forth herein may be altered without varying from the scope of the present disclosure.

An in-vehicle compute system may include or be connected to various vehicle systems, sub-systems, software applications and hardware components that include one or more processors to control input/output, display, playback and other operations. Various sensors and actuators on the vehicle provide input signals and output signals to the in-vehicle compute system. The sensors may include, but are not limited to, microphones, cameras, motion sensors, clocks, thermometers, location sensors, analog signals, digital signals, etc. coming from vehicle data networks such as CAN, AVB, GPS, Ethernet, etc. A non-volatile storage device may be included to store executable instructions. Vehicle control systems include controls for various vehicle systems involved in functions such as, but not limited to, audio, vehicle settings, engine, exhaust, transmission, safety, driver assistance, navigation, etc. Signals may be sent/received via wired connections, wireless connections, antenna(s). The vehicle systems providing inputs/outputs may also include a user interface such as a graphical user interface, a touch screen, and/or buttons, switches, knobs, dials, sliders, etc. that are actuated by a user. Alternatively, the user may interface with various vehicle systems communicating with the in-vehicle compute system, via mobile device such as a smart phone or tablet.

Figure 1:
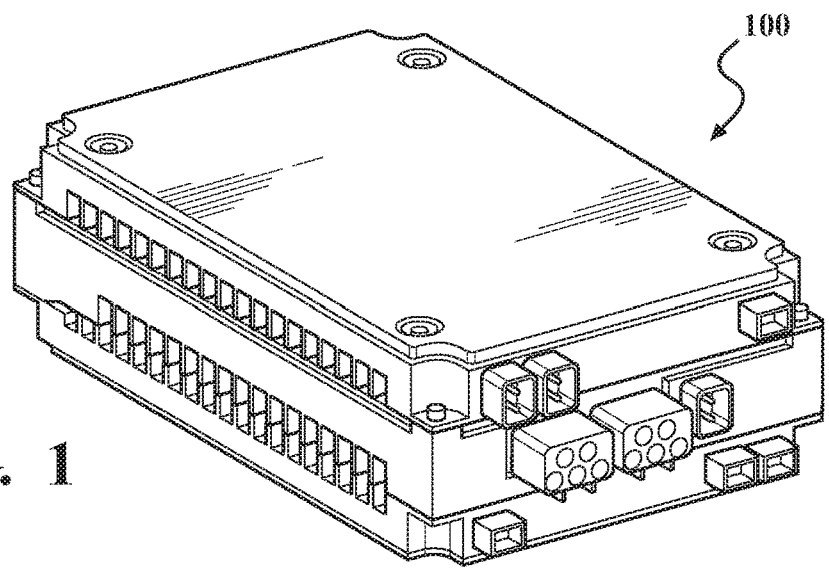
FIG. 1 is a perspective view of a generic domain compute system.
Figure 2:
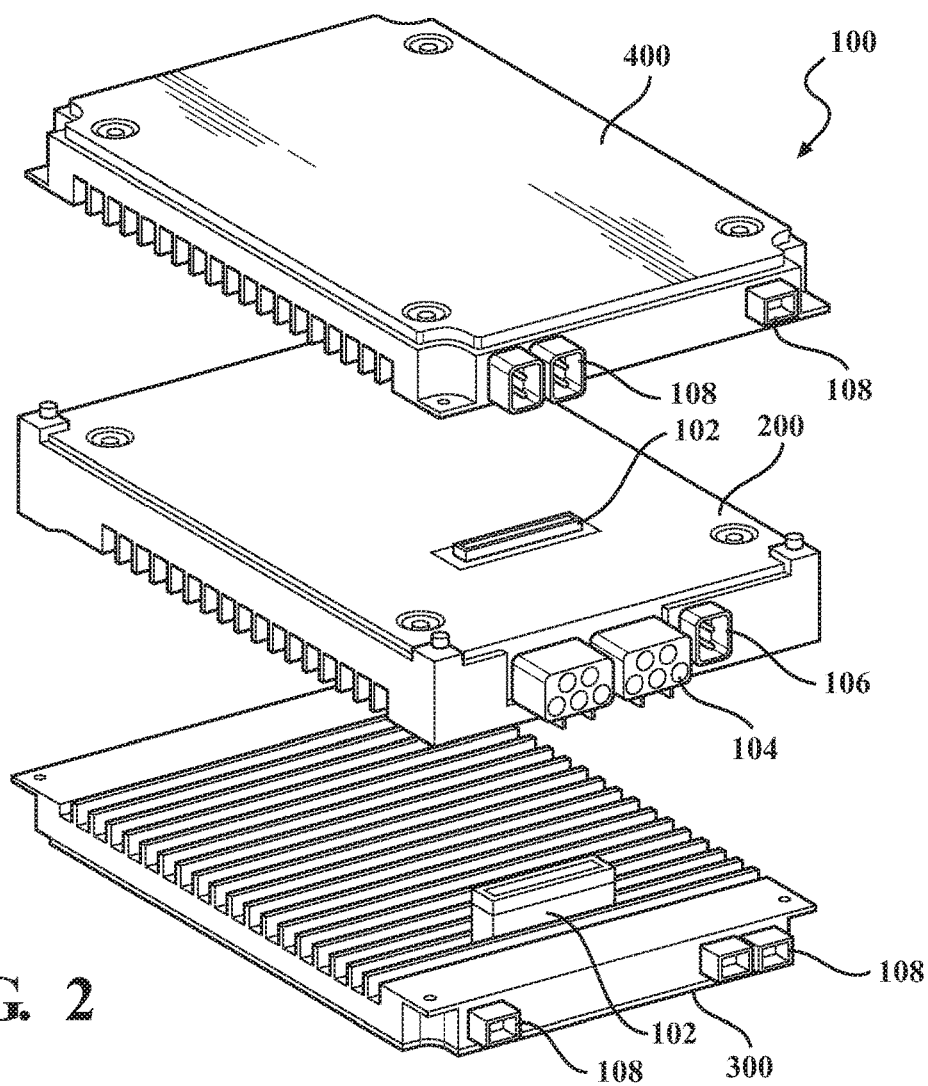
FIG. 2 is an exploded view of the generic domain compute system.

FIG. 1 is a perspective view of one or more embodiments of a generic domain compute system 100 of the inventive subject matter. FIG. 2 is an exploded view of the generic domain compute system 100 shown in FIG. 1. The generic domain compute system 100 has a data gateway 200, or an inner box, a first compute extension 300, or first outer compute node and a second compute extension 400, or second outer compute node.

The system 100 may be assembled with the data gateway 200 between the first compute extension 300 and the second compute extension 400. The arrangement allows maximum re-use of hardware and software assets and board support packages between different domain computes. Standardized connectors internally and for connection in the vehicle provide for exchange of either, or both, the first and second outer compute nodes. For example, in factory, garage or repair situations.

The system 100 may include a housing, not shown. In one or more embodiments the housing may include multiple lengths of the system assembly, for example two systems within a housing having a flat design. There are variants of the domain compute module which necessitate multiple lengths for the housing. For example, a domain compute with an SoC or with a redundant power supply are larger than a standard domain compute module. There are also variants of COMEX that will affect the length of the housing. For example, there are variants of the compute extensions that affect the length.

The system 100 shown in FIGS. 1 and 2 is for example purposes and it is possible to have fewer compute extensions, or none, depending on the domain or zone compute application of the generic domain compute system 100 that is being implemented in the vehicle. Hardware components and board support packages are shared among the data gateway and compute extensions, which are designed to be scalable and interchangeable depending on the domain or zone compute application.

Inter-connection between the data gateway 200 and the compute extensions 300, 400 is by way of an internal connector 102, as can be seen in FIG. 2. The internal connector 102 is standardized and is also scalable. External inter-connection is by way of external connector interfaces that are also standardized and scalable for different inputs. Some external connectors may be pin compatible and replaceable. Examples of external connections are, but not limited to, extendable high-speed connection interface 104, extendable vehicle main interface 106, extendable Automotive Audio Bus (A2B) interface 108. Furthermore, the first and second compute extensions may be connected to each other, for example, by outer cabling (not shown).

Figures 3A, 3B, 3C:
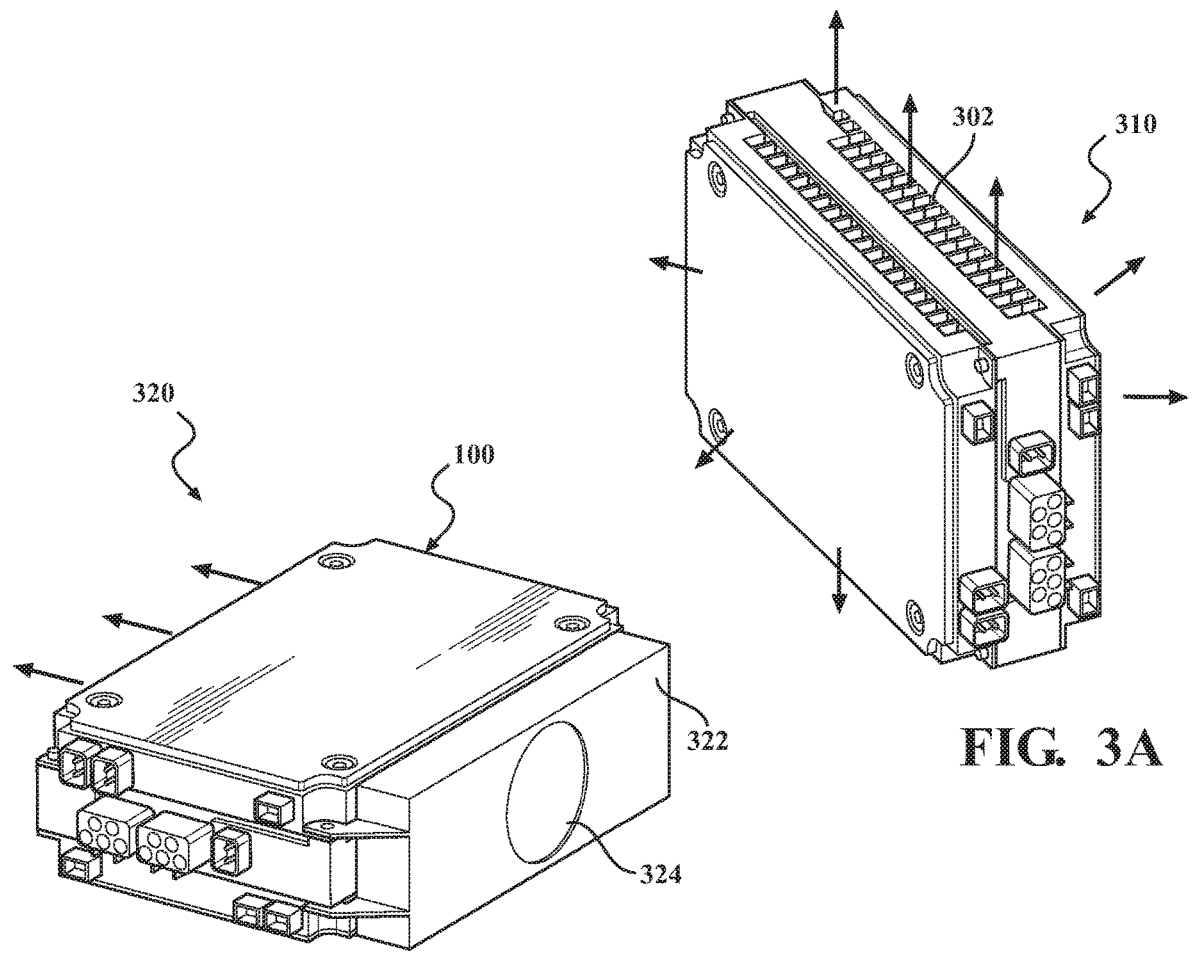
FIG. 3A is a perspective view of the generic domain compute system having passive cooling.
FIG. 3B is a perspective view of the generic domain compute system having active air cooling.
FIG. 3C is an exploded perspective view the generic domain compute system having active air cooling.

Referring now to FIGS. 3A-3E, a variety of cooling options are available, and a particular cooling option is determined by the domain or zone compute application being implemented in the vehicle. FIG. 3A is a perspective view of a passive cooling option 310 having vents 302. System power and thermal requirements may dictate the material used for passive cooling. For example, die cast aluminum, sheet metal aluminum, plastic, etc.

The domain or zone compute application dictates the type of cooling that should be applied to the system. The passive cooling option may be applied to a system having lower computing power and a system that requires higher computing power, such as Automated Driver Assistance System or CABIN domain, may require an active cooling system such as forced air or liquid cooling.

FIGS. 3B and 3C depict an active cooling option 320 having a fan module 322. The cooling requirements may dictate the type and number of fans 324 in the module 322. The module 322 itself is interchangeable.

Figure 3D:
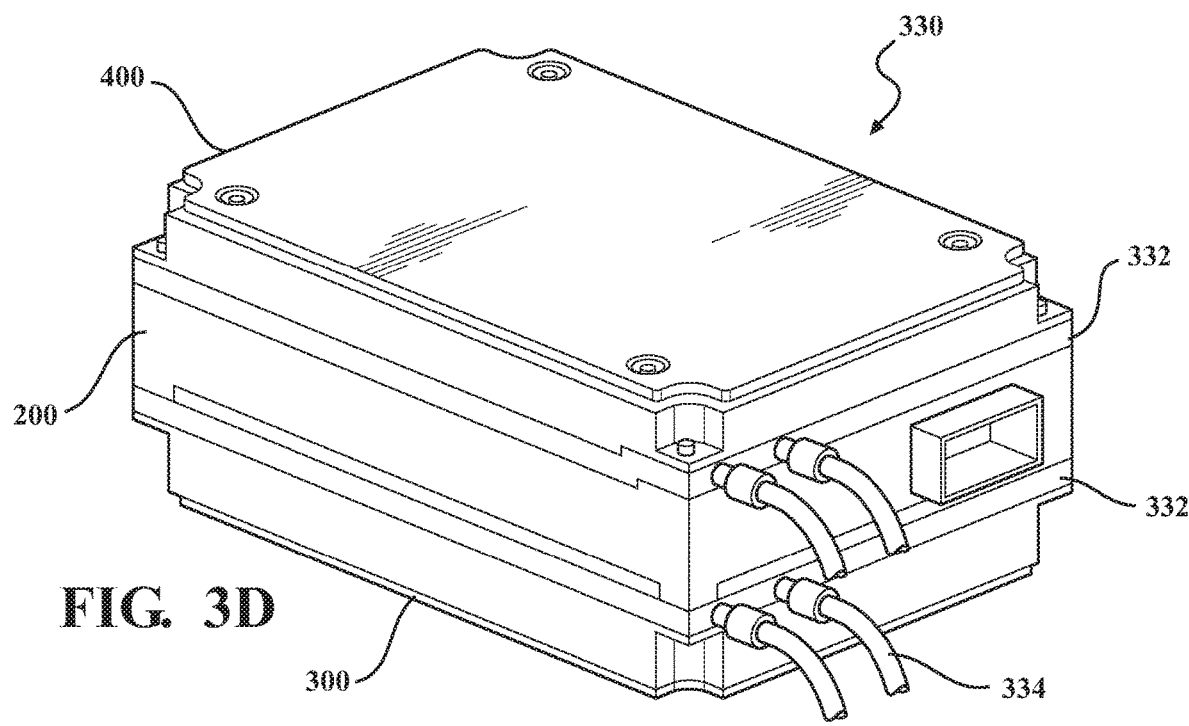
FIG. 3D is a perspective view of the generic domain compute system having liquid cooling.
Figure 3E:
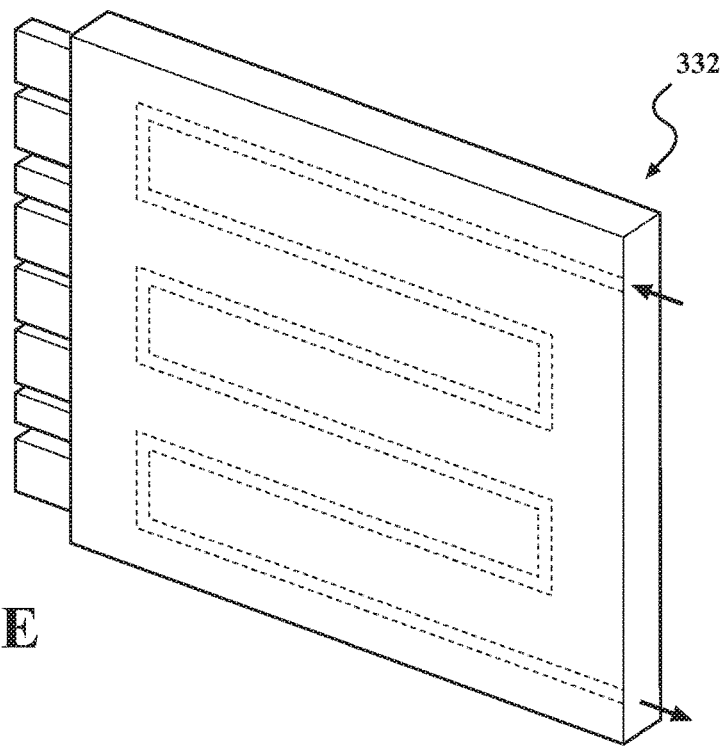
FIG. 3E is a perspective view of a water channel for the generic domain compute system having liquid cooling.

FIGS. 3D and 3E depict an active cooling option 330 having channels 332 fed by ports 334 for circulating a cooling liquid such as water. FIG. 3E shows a perspective view of the channels 332 that are integrated into the chassis between the data gateway 200 and the first and second compute extensions 300, 400 as shown in FIG. 3D.

Figure 4:
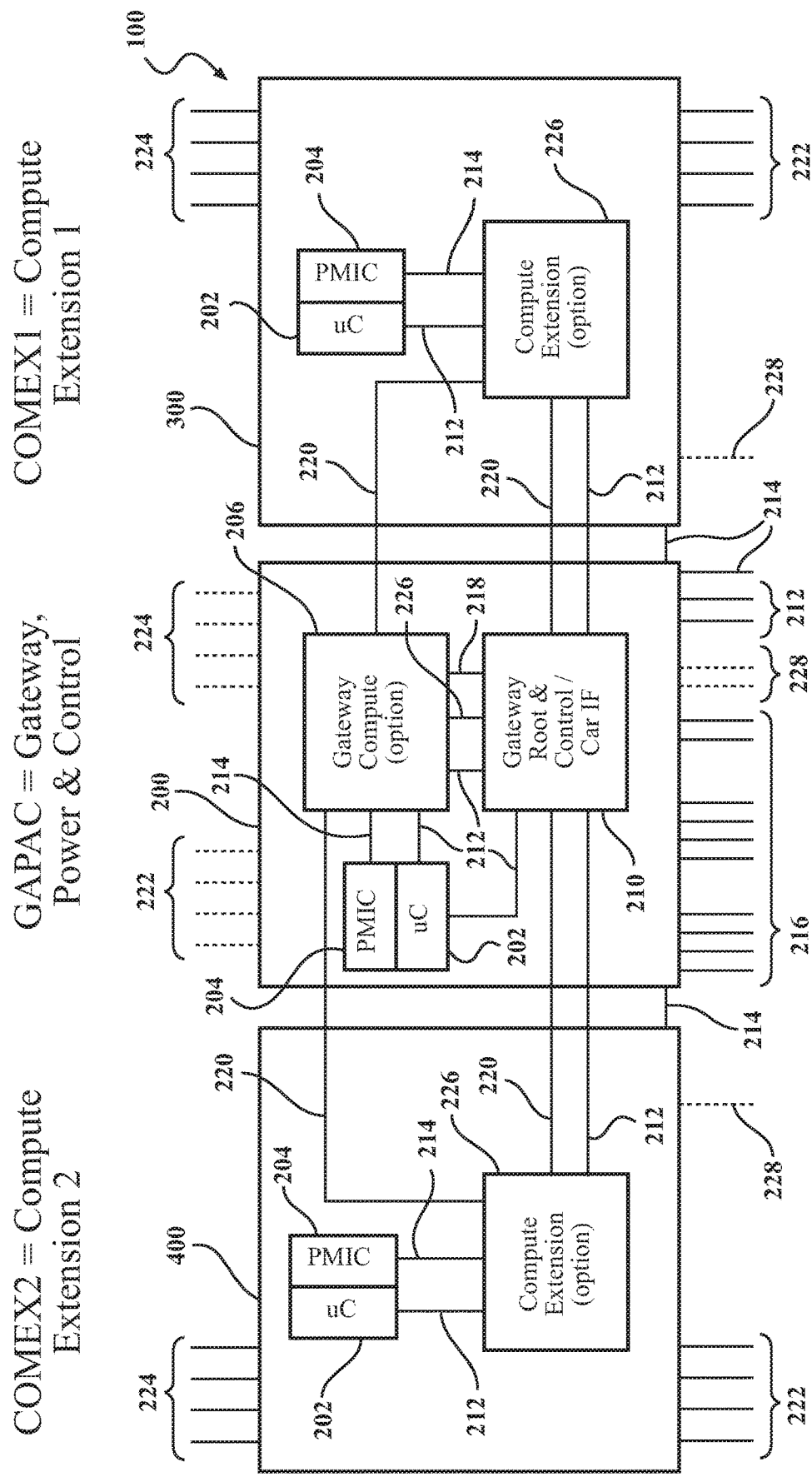
FIG. 4 is a block diagram of a generic domain compute system having a data gateway and two domain compute extensions.

FIG. 4 is a block diagram of one or more embodiments of the generic domain compute system 100 and the associated interfaces. The data gateway 200 is a Gateway Power and Control (GAPAC) having connections and interconnections 214 to a power supply (not shown), a microcontroller 202 and a power management integrated circuit (PMIC) 204 for managing the power connections 214. Each compute extension 300, 400 also has a microcontroller 202 and a PMIC 204.

The data gateway 200 contains a base set needed for scaling one or more of the individual domain computes. The data gateway 200 may also have an optional gateway compute 206 for scaling computing power. Each compute extension 300, 400 may also have an optional compute extension 226.

The data gateway 200 houses the Gateway/Data Routing capability, base Central Processing Unit (CPU)/SoC performance, and a vehicle interface 210. The power management integrated circuit 204 may include variants for 12V, 48V, Redundant power, and control 212 of other peripherals for system management (ON/OFF, Thermals, Safety, Security). The data gateway 200 hosts Ethernet connections 216 for which Gateway/Data Routing covers at least one, and likely ten or more, Ethernet inputs including a domain compute interconnect 218, connection 220 to one or more compute extensions 300, 400, sensor and or data interfaces 222, actuator output 224, Ethernet and/or controller area network (CAN).

Each function running on the data gateway 200 may handle data coming out of different streams or parts of the streams. The optional gateway compute 206 may increase the level intelligence of switch or routing logic for the data gateway 200. The allocation of a core performing calculation of a specific task is not fixed. For example, allocation may be changed dynamically through dynamic load control or on-demand such as cloud-based using physical twin and Over the Air (OTA). Sensor data may be shared between different compute extensions. Safety and security requirements are also considered.

The domain compute extensions 300, 400 are extensions of basic functions. For example, any compute extension 300, 400 (COMEX) may apply to CABIN domain, BODY domain, CHASSIS domain, ADAS/AD domain. The domain compute extensions 300, 400 are scalable with respect to performance. Each COMEX may be differentiated based on compute power and physical size. Any combination of the domain compute extensions 300, 400 is possible such as SoC/Compute node, audio node, telematics node and graphic or NPU nodes. However, the size of each domain compute extension 300, 400 is standardized to a minimal number of variants, all fitting to an EL/ME concept and connections.

The power supply (not shown) is an external supply to the ECU. It may be 12V or 48V. The external power supply has been filtered and is distributed internally from the GAPAC to each COMEX. Each SoC and microcontroller may have an individual PMIC for local power.

As discussed above, connections for the data gateway 200 and compute extensions 300, 400 are standardized with respect to pinning and form. The internal connector provides power, control and generic high-speed busses for connection (Ethernet, PCIe, or Thunderbolt or alternative generic data interfaces). For external connection, the data gateway 200 includes the car connector. Each compute extension 300, 400 hosts input 222 and output 224 connectors.

The generic domain compute system 100 includes several interfaces. Control interface 218 is external and internal. External control is realized by CAN, General Purpose Input Output (GPIO), and Ethernet. Internal control may be realized by Inter-Integrated Circuit (I2C or SPI) between the data gateway control and the microcontrollers of SoCs replacing multiple GPIO and level shifting. For safety SoC, this includes fault detection and needed redundancy.

Each compute system may include a Peripheral Component Interconnect express (PCIe) interface 228 may be Gen 4 and Gen 5 or Thunderbolt. Potential extension to Cache Coherent Interconnect for Accelerators (CCiX) or Compute Express Link (CXL). This could be dependent upon whether compute extension to compute extension inter-connection is internal or external.

PMIC 204 internally distributes power 214 from the data gateway 200 to the compute extensions 300, 400, preferably on a 12V level with one voltage rail due to overall power efficiency. The data gateway 200 contains part of the power supply with external distribution of power of 12V or 48V. Each compute extension 300, 400 is supplied with non-switched power rails (permanent voltage). Each compute extension 300, 400 is supplied with permanent voltage and realizes its own power supply and sleep current concept. For a compute extension that supports ADAS L2 and higher, a redundant external supply should exist. The data gateway 200 includes central filtering of all overvoltage spike. A voltage booster protects the compute extensions 300, 400 from under voltage drops. The data gateway 200 supports power management to control voltage behavior such as operating current, sleep current control and Suspend to RAM.

Sensor Interfaces 222 interconnect to in-vehicle sensors or data input used for different use cases in different domains, with different interfaces such as video-in or Ethernet IP. Standardization of the interfaces and sensor data is mainly driven by a need for sharing raw data between different domains with point-to-point, daisy chaining or in a network. Examples are camera input, radar or lidar data input or other kinds of sensors and data. Adaptive Security Appliances (ASAs) or NAV alliance are examples of the standardization bodies that determine the need for sharing sensor data and the manner that the sensor data may be shared.

Actuator outputs 224 are the main interface to an actuator or display. For example, a graphic output interface to one or more displays in the vehicle. The outputs may be mainly Low Voltage Differential Signaling (LVDS) in daisy chain technology or Ethernet IP.

Performance of the system 100 may be realized by scaling the CPU, Graphic Processing Unit (GPU) and Network Processing Unit (NPU) performance with data throughput potential of the gateway SoC 202. Safety support may be realized whether with ASILB/C or ASILD depending on the specific use cases to be supported. Safety requirements may be satisfied by modifying both Gateway Power and Control (GAPAC) and Compute extension and interconnect.

Either or each of the compute extensions 300, 400 may need an interface derivative, such as antenna connectors, for example for a Telematics node or an Automotive Audio Bus (A2B) node.

Several variations of the data gateway, several variations of the compute extension and several variations of the inter-connect are provided and may be customized for a domain or zone application in the vehicle. The variants of a single data gateway, one or two compute extensions, and an inter-connect may be combined in several different configurations in a box-on-box configuration to customize a system, or module, that may be applied for a particular domain or zone compute purpose on the vehicle. Further, the system may include multiple domain computes. Still further, multiple modules may be combined and included in a single housing. The housing may be a flat design with two lengths of domain compute modules. This system hardware solution allows maximum re-use of hardware and software assets and board support packages in between domain computes in the vehicle, thereby reducing cost and time to market.

The data gateway 200 in general has Ethernet and CAN. Performance is realized by scaling CPU performance and data throughput capabilities of gateway SoC, which may be integrated or separate. Safety support may be realized whether ASIL B/C or ASIL D. The data gateway, also called a Gateway Power and Control (GAPAC) may have a single or redundant power supply, 12V or 48V. Variations of the data gateway 200 may include but are not limited to a GAPAC that includes gateway and power control 12V, a GAPAC that includes gateway power and control 48V, a GARPAC that has redundant power and control, and a GAPAC_C having GAPAC with base compute (two silicons).

The compute extension hosts SoC with sensor input and individual output and is also called a COMEX. One or two COMEXs may be combined with a GAPAC variation to create the module. Variations of the COMEX include, but are not limited to, a COMEX low, a COMEX medium, a COMEX high, a COMEX audio, A COMEX telematics, a COMEX ADAS Low, a COMEX ADAS high, and a COMEX Graphic/Network Processing Unit (NPU). The qualifiers "low", "medium" and "high" refer to computing power and size.

The inter-connects variations include, but are not limited to, an external car connect for connecting GAPAC with the vehicle. An external output for connecting a COMEX or GAPAC with an output such as a display, zone control, drive . . . ). An external sensor for connecting a COMEX with sensors on the vehicle. An External antenna for connecting a COMEX telematics with an antenna. An external loop for connecting a GAPAC with another GAPAC. An external loop back for connecting a COMEX to another COMEX.

FIGS. 5-10 are examples of system applications of the domain compute system 100 using combinations of different variations of the GAPAC, GARPAC, GAPAC_C, COMEXs and inter-connects to create specific domain computes for a vehicle environment. The COMEXs (compute extensions) may be compute node, audio node, ADAS base node, ADAS High node or a telematics node to name a few. FIG. 11 is a chart 1100 of a component view for each of the example applications presented in FIGS. 5-10 further detailing the external interconnect and cooling requirements for each example.

Figure 5:
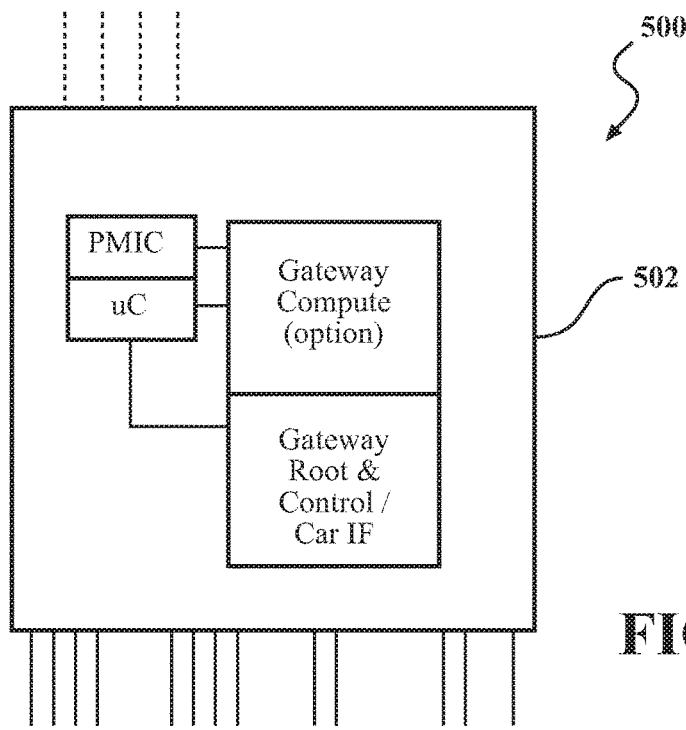
FIG. 5 is a block diagram of a Body Domain or Chassis Domain Compute.

FIG. 5 is an example of a Central Gateway, Body Domain, or Chassis Domain compute 500. This example includes GARPAC 502 as a central gateway for gateway power and control. Central Gateway or Body Compute 1102 has GARPAC and no COMEX. There is no inter-connect loopback because there are no COMEXs. This example may use passive cooling.

Figure 6:
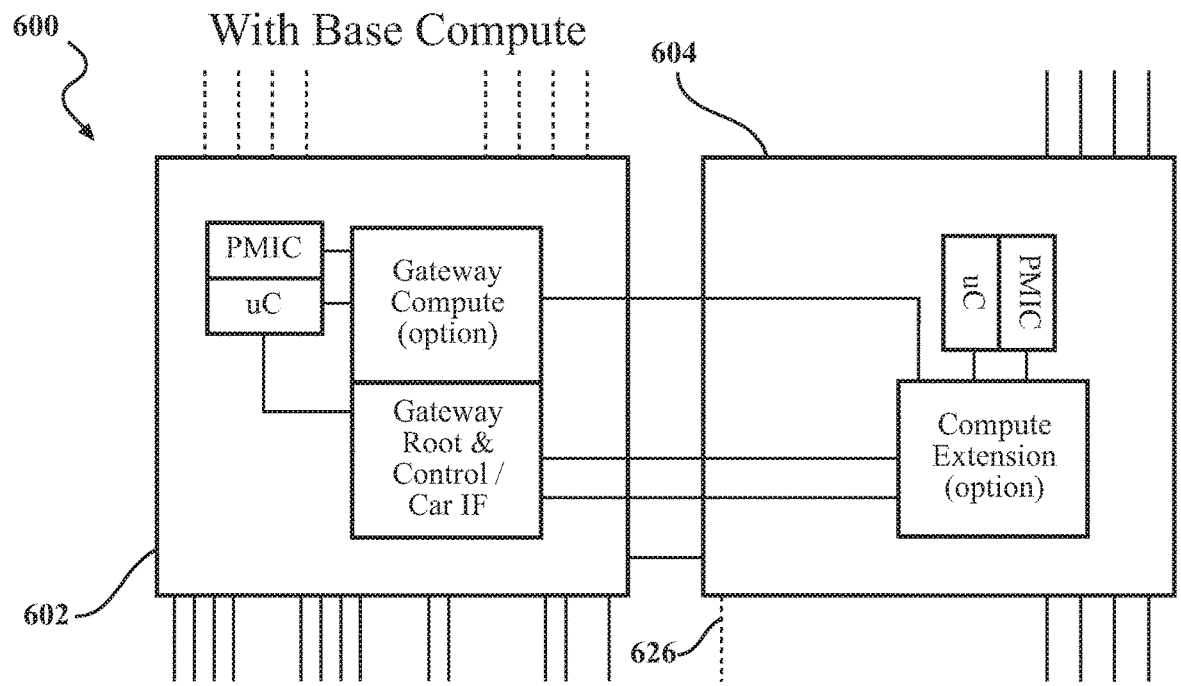
FIG. 6 is a block diagram of a Domain Compute CABIN.

FIG. 6 is an example of a CABIN compute 600 module having a GAPAC_C 602 and a first COMEX comprising a compute node. The compute node may be any one of a low, medium or high computing capability depending on its environment and application. The compute node 604 may have an optional PCIe 626 or similar. Referring to FIG. 11, for the Domain Compute CABIN 1104 no loop back interconnect is needed and at least air cooling is used.

Figure 7:
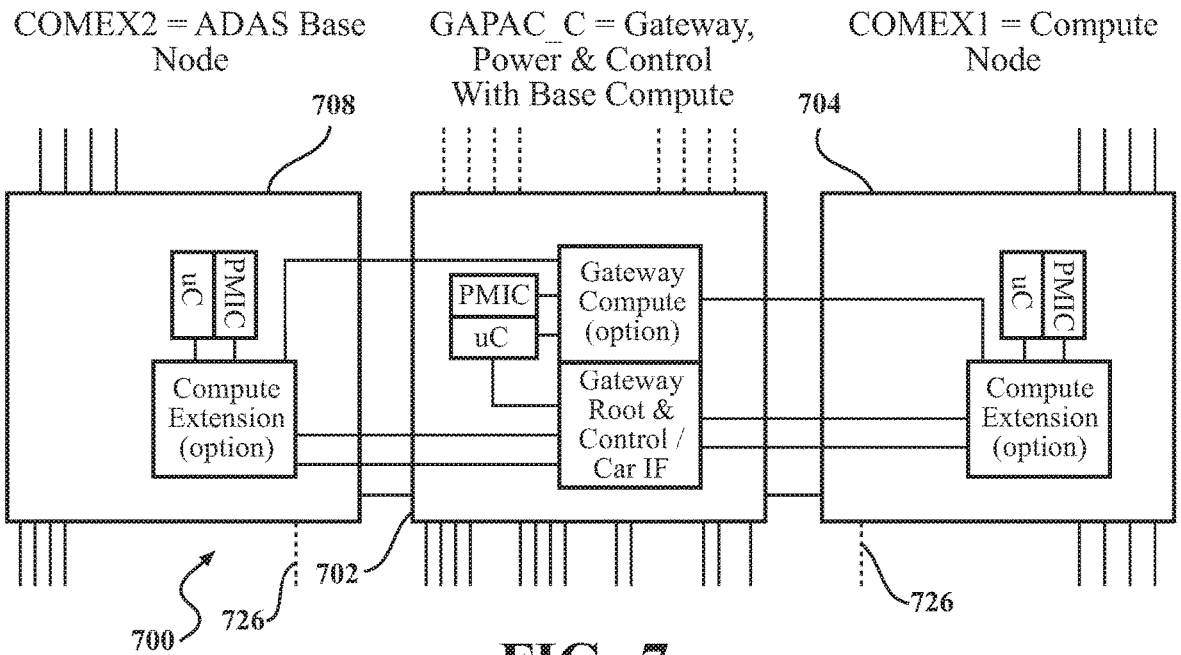
FIG. 7 is a block diagram of a Domain Compute CABIN with Base ADAS functions.

FIG. 7 is an example of a CABIN with Base Autonomous Functions 700. A GAPAC_C 702, a COMEX compute node 704, and a second COMEX ADAS Base node 708. Again, the COMEX compute node 704 may have an optional PCIe 726 or similar. Referring to FIG. 11, the requirements for the CABIN with Base Autonomous Functions 1106 have loop back to externally inter-connect the COMEX compute node and the COMEX ADAS Base node. At least air cooling is used.

Figure 8:
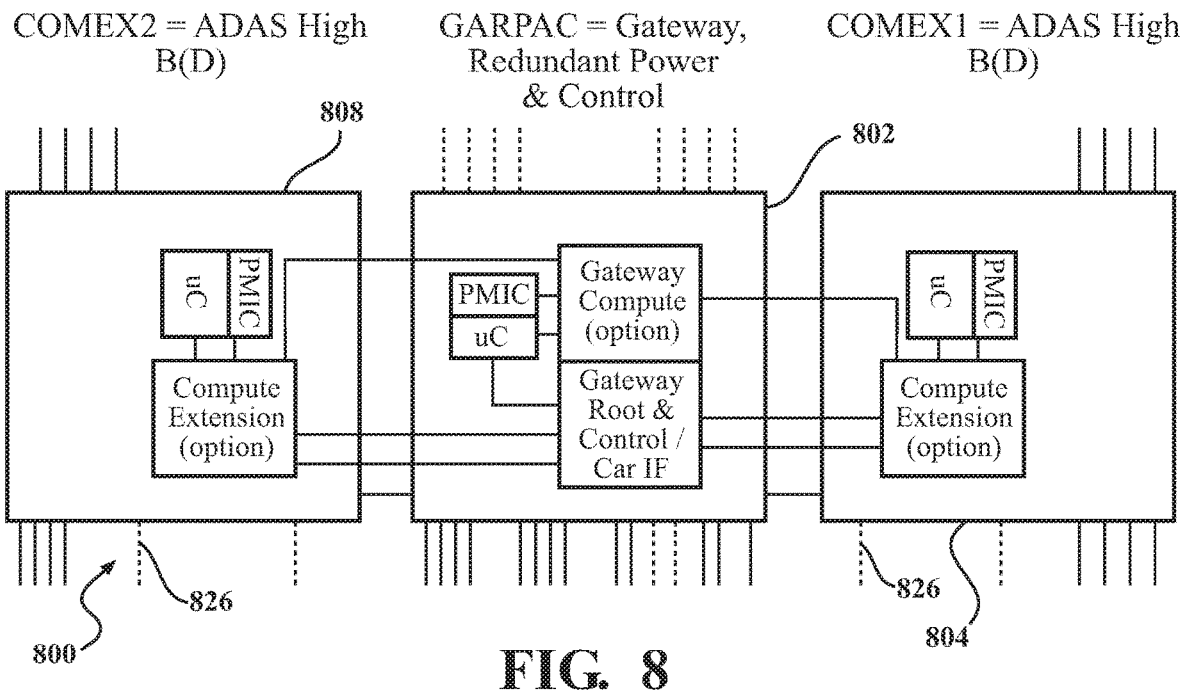
FIG. 8 is a block diagram of a Domain Compute ADAS High.

FIG. 8 is an example of ADAS compute high 800 having a GARPAC 802, a first COMEX ADAS High node 804 and a second COMEX ADAS high node 808. Each node 804, 808 may have an optional PCIe 826 or similar. Referring to FIG. 11, the ADAS Compute high 1108 does not require an external connect. Air or liquid cooling may be utilized.

Figure 9:
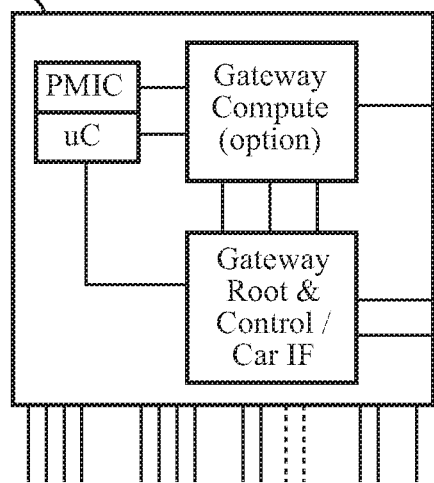
FIG. 9 is a block diagram of a Telematics Gateway.
Figure 9:
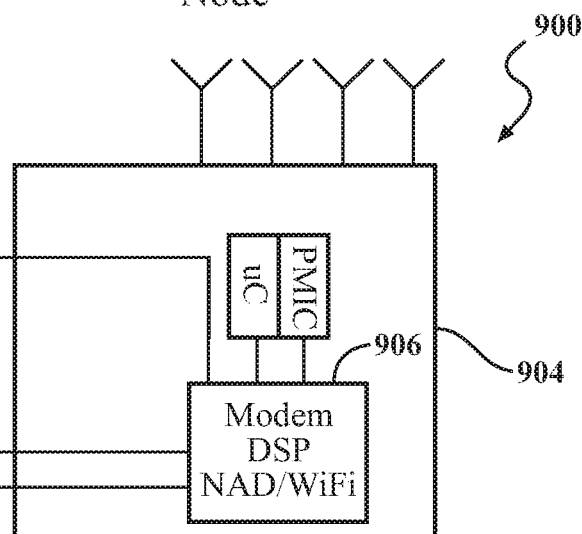

FIG. 9 is an example of a telematics gateway 900 having a GAPAC_C 902 and a COMEX telematic node 904. The COMEX telematic node 904 includes a telematics interface device 906 such as a Modem, DSP, NAD and WiFi capability. Referring to FIG. 11, for the central gateway and telematics application 1110 no external inter-connect is needed and passive cooling is sufficient.

Figure 10:
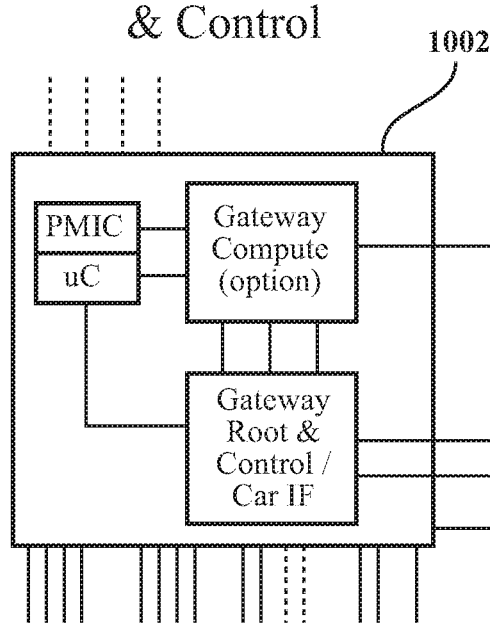
FIG. 10 is a block diagram of a Domain Compute BODY and Audio node.
Figure 10:
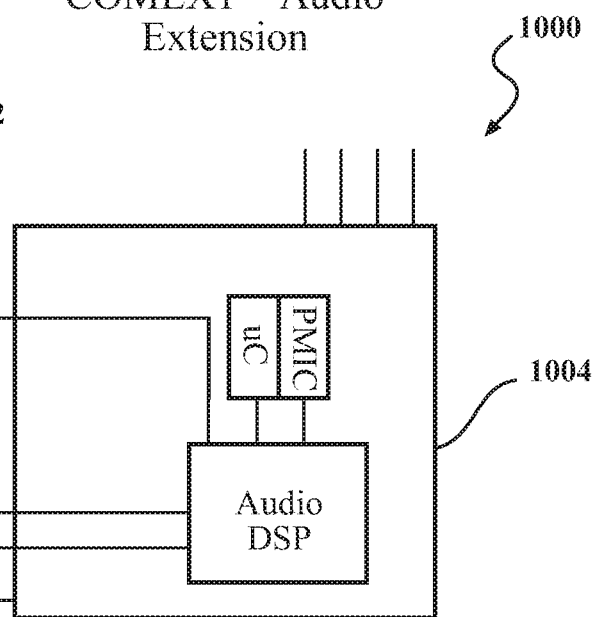

FIG. 10 is an example of a Body Compute and Audio 1000 having a GARPAC 1002 and a COMEX audio node 1004. Referring to FIG. 11, the Body Compute and Audio 1112 does not require external inter-connect. Due to the processing power required for the audio node, air or liquid cooling is implemented.

In the foregoing specification, the present disclosure has been described with reference to specific exemplary embodiments. Various modifications and changes may be made, however, without departing from the scope of the present disclosure as set forth in the claims. The specification and figures are illustrative, rather than restrictive, and modifications are intended to be included within the scope of the present disclosure. Accordingly, the scope of the present disclosure should be determined by the claims and their legal equivalents rather than by merely the examples described. Additionally, the components and/or elements recited in any apparatus claims may be assembled or otherwise operationally configured in a variety of permutations and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

The terms "comprise", "comprises", "comprising", "having", "including", "includes" or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present disclosure, in addition to those not specifically recited, may be varied or otherwise particularly adapted to specific environments, manufacturing specifications, design parameters or other operating requirements without departing from the general principles of the same.

What is claimed is:

1. An in-vehicle compute system, comprising:
a data gateway having a scalable central processing unit to increase or decrease a processing power of the processing unit, a power supply, a power management circuit, data routing capability, one or more scalable interfaces to modify a number and a type of interface for data routing, one or more scalable interfaces to modify a number and type of interface for sensor inputs, one or more scalable interfaces to modify a number and type of interface for actuator outputs, and an interface to a controller area network (CAN) on the vehicle; and
a first compute extension connected to the data gateway, the first compute extension has a scalable microcontroller to increase or decrease a processing power of the microcontroller, a power management integrated circuit, and one or more scalable interfaces to modify a number and type of interface for actuator outputs.

2. The system of claim 1 wherein the first compute extension further comprises one or more scalable interfaces to modify a number and type of interface for sensor inputs.

3. The system of claim 1, wherein the data gateway further comprises a base compute and the first compute extension further comprises a telematics interface device.

4. The system of claim 1, wherein the data gateway has a redundant power supply.

5. The system of claim 1, wherein the data gateway has an additional controller.

6. The system of claim 1, further comprising a module for air cooling the system, the module is attached to an end of the in-vehicle compute system.

7. The system of claim 1, further comprising a liquid cooling plate between the data gateway and the first compute extension.

8. The system of claim 1, further comprising a second compute extension connected to the data gateway, the second compute extension has a scalable microcontroller to increase or decrease a processing power of the microcontroller, a power management integrated circuit and one or more scalable interfaces to modify and number and type of interface for actuator outputs.

9. The system of claim 8, wherein the second compute extension has one or more interfaces for actuator outputs.

10. The system of claim 8, wherein an external loop connector interconnects the second compute extension to the first compute extension.

11. A method for customizing a generic domain compute system for at least one domain compute application in a vehicle, the method comprising the steps of:
interconnecting a gateway power and control (GAPAC) module having a power management integrated circuit (PMIC), a set of standardized and scalable external connectors for modifying a number and type of interface for sensor inputs, a set of standardized and scalable external connector for modifying a number and type of interface for actuator outputs, a standard and scalable internal connector for modifying a number and type of internal inter-connections for power, control and generic busses to at least a first compute extension (COMEX) having a standard and scalable connecter internally connected to the GAPAC, a scalable microcontroller for increasing or decreasing a processing power of the microcontroller, a power management integrated circuit and a set of standardized and scalable connectors for modifying a number and type of external inter-connections, the at least one COMEX is supplied with a permanent voltage from the GAPAC PMIC; and scaling the scalable microcontrollers, scalable external connectors and scalable internal connectors according to the processing power, number and type of interfaces, sensors, and actuators of the at least one domain compute application.

12. The method of claim 11, wherein the PMIC manages a power supply having a voltage that depends on the at least one domain compute application.

13. The method of claim 12, wherein the GAPAC has a PMIC that manages a redundant power supply.

14. The method of claim 11, further comprising the step of interconnecting the GAPAC to a second COMEX having a standard and scalable connector internally connected to the GAPAC, a scalable microcontroller, a power management integrated circuit and a set of standardized and scalable connectors for modifying a number and type of external inter-connections, the second COMEX is supplied with a permanent voltage from the GAPAC PMIC.

15. The method of claim 13, further comprising the step of interconnecting the at least one COMEX and the second COMEX using an external loop connector as determined by the at least one domain compute application.

\* \* \* \* \*